(12) United States Patent
Kaji et al.

(10) Patent No.: US 7,879,405 B2
(45) Date of Patent: Feb. 1, 2011

(54) RESIN COMPOSITION FOR SEALING LIGHT EMITTING DEVICE

(75) Inventors: Satoru Kaji, Kurashiki (JP); Taketoshi Usui, Yokohama (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 333 days.

(21) Appl. No.: 11/140,197

(22) Filed: May 31, 2005

(65) Prior Publication Data

US 2005/0272896 A1    Dec. 8, 2005

(30) Foreign Application Priority Data

Jun. 2, 2004    (JP)    ............................. 2004-164717

(51) Int. Cl.
*C08G 77/14*    (2006.01)

(52) U.S. Cl. .................. 427/387; 428/447; 528/27; 528/40

(58) Field of Classification Search .................. 528/27, 528/40; 427/387; 428/447
See application file for complete search history.

(56) References Cited

U.S. PATENT DOCUMENTS

| | | | | | |
|---|---|---|---|---|---|
| 2,843,560 | A | * | 7/1958 | Mika | ............................ 528/27 |
| 4,666,745 | A | * | 5/1987 | Huhn et al. | ............... 427/393.4 |
| 5,188,903 | A | * | 2/1993 | Liao et al. | .................... 428/447 |
| 6,391,999 | B1 | * | 5/2002 | Crivello | ........................ 528/12 |
| 6,632,892 | B2 | * | 10/2003 | Rubinsztajn et al. | ......... 525/476 |
| 7,279,223 | B2 | * | 10/2007 | Rubinsztajn et al. | ......... 428/414 |

FOREIGN PATENT DOCUMENTS

| | | |
|---|---|---|
| JP | 60-124617 | 7/1985 |
| JP | 2-281069 | 11/1990 |
| JP | 7-25987 | 1/1995 |
| JP | 2003-192790 | 7/2003 |
| JP | 2004-250604 | 9/2004 |
| JP | 2005-171021 | 6/2005 |
| JP | 2005-263869 | 9/2005 |

* cited by examiner

*Primary Examiner*—Margaret G Moore
(74) *Attorney, Agent, or Firm*—Finnegan, Henderson, Farabow, Garrett & Dunner, L.L.P.

(57) ABSTRACT

A curable composition for sealing a light emitting device, comprising a modified polysiloxane containing, in a molecule, not less than one alicyclic hydrocarbon group and not less than two epoxy groups.

6 Claims, No Drawings

RESIN COMPOSITION FOR SEALING LIGHT EMITTING DEVICE

BACKGROUND OF THE INVENTION (1) Field of the Invention

The present invention relates to an epoxy modified polysiloxane useful for sealing light emitting devices which exhibit excellent light resistance and excellent adhesiveness.

(2) Description of the Related Art

Recently, for blue light emitting diodes (hereinafter abbreviated as LED) and ultraviolet light emitting diodes having a wavelength of 250 nm to 550 nm, high brightness products using a GaN type compound semiconductor such as GaN, GaAlN, InGaN and InAlGaN have become available, and as a result, the formation of high definition full color images has been achieved in combination with red LEDs and green LEDs. In addition, by combining a blue LED or a ultraviolet LED with fluorescent materials, white LEDs have been obtained and the demands for backlights of liquid crystal displays and general lighting are expected to increase.

Conventionally, as a sealing agent for light emitting devices such as red or green LEDs, epoxy resins using an acid anhydride type curing agent have been used because of the high adhesiveness and the excellent mechanical durability they provide. However, such epoxy resin sealing agents have had the problem that the agents have a low light transmittance against blue to ultraviolet light in short wavelength regions and cause coloring due to photodegradation which has resulted in low light resistance against light in short wavelength regions. To overcome this defect, the use of an alicyclic hydrocarbon epoxy resin as a main component has been suggested in some publications (JP-A-11-274571, JP-A-2000-196151 and JP-A-2002-226551). The level of the light resistance, however, is still insufficient and further improvement is required.

Studies of the present inventors have revealed a tendency for an alicyclic hydrocarbon epoxy resin to have decreased adhesiveness compared to a corresponding aromatic hydrocarbon epoxy resin and the adhesiveness and the light resistance have a trade-off (opposing) relationship.

On the other hand, as a sealing agent that has high light resistance against light in short wavelength regions, silicone resins have been used. Generally, silicone resin sealing agents have low adhesiveness, and light emitting devices which frequently have a remarkable heat shock because of the on-off of light emission and no light emission or the conditions of installation in the apparatus are often associated with problems such as peeling between the device and the sealing agent due to the differences in the coefficient of thermal expansion, humidity invasion due to the peeling, and deterioration of the device. For this reason, there are proposals for using a mixture of silicone resin and an epoxy resin, which together are excellent in adhesiveness (JP-A-2002-324920). The properties required for adhering the device and the sealing agent naturally depend on the purpose of use, but, unfortunately, the adhesiveness is still insufficient for such use as white LEDs, backlights of liquid crystal displays and general lighting where the devices are exposed to outside air or subjected to long and continuous use. Further improvement of the adhesiveness is therefore strongly required.

Thus, to what level a modified silicone, in which an alicyclic hydrocarbon epoxy group is introduced into the side chain of the silicone skeleton, which is a candidate material having both the excellent adhesiveness and the durability of an epoxy and the excellent light resistance of a silicone, can achieve both the adhesiveness and the light resistance required has been open to investigation.

A modified silicone having a similar structure and containing an aromatic hydrocarbon epoxy group has been disclosed in, for example, JP-A-2-028211, JP-A-4-034908 and Japanese Patent No. 3283606. In addition, those skilled in the art have had the common knowledge that replacement of the aromatic hydrocarbon moiety with an alicyclic hydrocarbon improves the light resistance as disclosed in JP-A-11-274571, JP-A-2000-196151 and JP-A-2002-226551. Therefore, the essential issue of the investigation is naturally the level of the adhesiveness.

As a result of detailed studies of the present inventors on a synthesis method and use of modified polysiloxane containing alicyclic hydrocarbon epoxy group, it has been found that a paper describing a method for the synthesis of the above-mentioned compound has already been published by Crivello et al in 1990 (J. V. Crivello and J. L. lee, The Synthesis, Characterization and Photoinitiated Cationic Polymerization of Silicon-Containing Epoxy Resins, Journal of Polymer Science: Part A: Polymer Chemistry, United States, John Wiley & Sons, Inc. (1990), Vol. 28, p. 479-503) and that there are also descriptions of the substance, i.e., an alicyclic hydrocarbon epoxy modified silicone itself in some specifications.

The substance is mostly used as, for example, a peeling agent or an anti-adhesive coating as shown in JP-A-2003-327664, JP-A-2001-220512, Japanese Patent No. 2623426 and National Publication of International Patent Application No. 2000-516660. Other uses include additives for resins (JP-A-10-152560, JP-A-6-299079 and JP-A-11-256035), gaskets JP-A-2000-508371 and Japanese Patent No. 3192155) and sealing agents for a housing (JP-B-6-017445), which are included in the category of general use of silicone resins.

When the compound is used for the surface treatment of release paper, to decrease adhesiveness, decreased adhesiveness is an essential condition as the word of "release" suggests. In short, the compound has been used for a purpose completely opposite from the purposes of the present invention such as for the sealing of light emitting devices, where to increase adhesiveness, increased adhesiveness is a requirement.

Although adhesiveness may be admittedly decreased to a certain degree, if the adhesiveness is decreased to a level for use as release paper, there has been no other choice, but to believe that the compound cannot be used for the sealing of light emitting devices at all, where a high adhesiveness is required.

Thus, it has been commonly inconceivable for those skilled in the art who can conduct a prior art search and do research and development activities to consider using an alicyclic hydrocarbon epoxy modified silicone, a characteristic which is low adhesiveness, for the purpose of sealing light emitting devices which require a high adhesiveness.

SUMMARY OF THE INVENTION

The present invention aims at providing an epoxy-modified polysiloxane useful for sealing light emitting devices which exhibit excellent light resistance and excellent adhesiveness.

The present inventors conducted studies on the use of a compound containing an alicyclic hydrocarbon epoxy group in the side chain of the silicone skeleton as a sealing agent for light emitting devices, and as least expected, they have found a sealing agent for light emitting devices that exhibits excellent light resistance and has at least no problem such as peeling from the light emitting device due to poor adhesiveness, and also has a small decrease in brightness over a long period. The present invention has been made based on these findings.

As a result of continued studies, it has been found that a modified silicone containing both an alicyclic hydrocarbon group and an epoxy group, which is not necessarily limited to an alicyclic hydrocarbon epoxy group, achieves the desired properties sought for the present invention.

According to the present invention, a curable composition for sealing light emitting devices such as a light emitting diode, that is particularly excellent in light resistance against light of 250 to 550 nm and which has a high adhesiveness, and a small decrease in brightness over long period and which causes no peeling between the device and the sealing agent can be obtained. The light emitting diode made according to the present invention is useful as, for example, backlights of liquid crystal displays, lighting, light sources for various sensors, printers and copying machines, light sources for automobile display, a signal light, an indication light, display apparatuses, light sources for a sheet illuminant, displays, decorations and other lights.

DETAILED DESCRIPTION OF THE INVENTION

The present invention is described in detail below.

The modified polysiloxane used in the present invention contains epoxy groups and an alicyclic hydrocarbon group (hereinafter referred to as EPS). The EPS may have any of a linear, cyclic, branched or ladder structure. It is represented by the following formula (a).

$$(R_a R_b R_c SiO_{1/2})_M (R_d R_e SiO_{2/2})_D (R_f SiO_{3/2})_T (R_g SiO_{4/2})_Q \quad (a)$$

where preferably $D/(M+D+T+Q)=0.1$ to 1, $M/(M+D+T+Q)=0$ to 0.5, $T/(M+D+T+Q)=0$ to 0.4, $Q/(M+D+T+Q)=0$ to 0.1; Ra to Rg are preferably independently a substituent selected from the following substituents, and in the same structural units, different substituents may be selected, that is, a plurality of Rds, for example, may be different substituents. Examples of Ra to Rg include hydrogen, a hydroxyl group, halogen or an organic group having 1 to 25 carbon atoms.

Examples of the organic group for Ra to Rg in the formula (a) include an alkoxy group, an acyloxy group, an oxime group, an amino group, a substituted or unsubstituted alkyl group and alkenyl group, a substituted or unsubstituted cycloalkyl group and a cycloalkenyl group having 6 to 25 carbon atoms, and a substituted or unsubstituted aralkyl group and aryl group having 6 to 25 carbon atoms. Examples of a functional group for substitution include an epoxy group, a hydroxyl group, an alkoxyl group, halogen, an amino group, an amide group, an aminoxy group, a mercapto group, an alkenyloxy group, an acyloxy group, an acid anhydride group, a carbonyl group, saccharide, a cyano group, an oxazolyn group and an isocyanate group.

When the average number molecular weight of the EPS is set to not more than 10000, there are preferable effects such that the viscosity of the sealing agent can be kept low and thus the processability is improved.

One kind of the EPS may be used or two or more kinds thereof may be mixed.

For the EPS, a modified polysiloxane in which a Si—C bond bonds a substituent having an epoxy group and a polysiloxane is preferred as the modified polysiloxane has excellent light resistance. A linear or cyclic modified polysiloxane represented by the formula (1) or the formula (2) (hereinafter the formulas in the present invention refer to average composition formula) is more preferred.

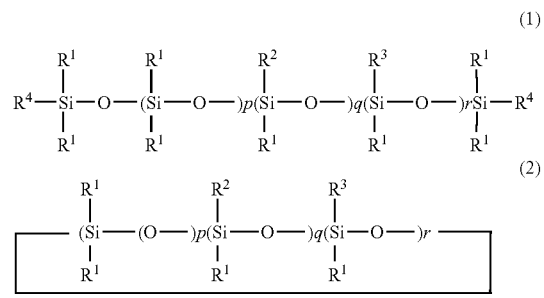

where $R^1$ is hydrogen, a hydroxyl group, an aliphatic hydrocarbon group having 1 to 6 carbon atoms or an alkoxy group having 1 to 6 carbon atoms, $R^2$ is a substituent represented by the formula (3) or the formula (4), $R^3$ is an alicyclic hydrocarbon group having 5 to 25 carbon atoms, $R^4$ is any group of $R^1$ to $R^3$, p and r are each an integer of $0 \leq p \leq 50$ and $1 \leq r \leq 50$, and q is an integer of $0 \leq q \leq 50$ when two $R^4$s are both $R^2$, $1 \leq q \leq 50$ when one of the two $R^4$s is $R^2$, and $2 \leq q \leq 50$ when neither of the two $R^4$s is $R^2$.

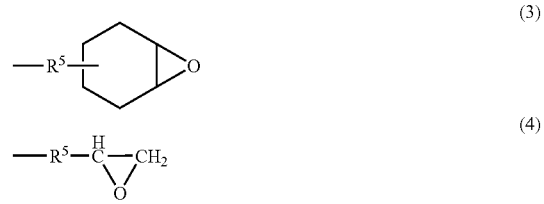

where $R^5$ is a divalent organic group having 1 to 10 carbon atoms and 0 to 5 oxygen atoms which bonds to Si via a carbon atom.

$R^1$ is preferably a hydrocarbon group having 1 to 25 carbon atoms, more preferably an aliphatic or alicyclic hydrocarbon group having 1 to 20 carbon atoms, and most preferably a methyl group. An organic group for $R^1$ may be one kind or a plurality of kinds thereof may be mixed.

$R^2$ is a substituent having an epoxy group and particularly preferred is a structure indicated in the formula (3) or the formula (4), and $R^2$ preferably has not less than two epoxy groups in a molecule. When not less than two epoxy groups are present in a molecule, a cured article is obtained having sufficient cross-linking density, high light resistance and high heat resistance.

$R^3$ is preferably an alicyclic hydrocarbon group having 6 to 20 carbon atoms. Specific examples thereof include a cyclohexyl group and a norbornyl group.

Specific examples of the formula (3) include an ethynylcyclohexene oxide group and specific examples of the formula (4) include a glycidyl group, an ethynylglycidyl ether group and a propyleneglycidyl ether group.

The substituents represented by the formula (3) are particularly preferred and ethynylcyclohexene oxide group is further preferred because a high light resistance and a high heat resistance can be obtained. The substituent may be one kind or a plurality of kinds thereof may be mixed.

Specific examples of $R^5$ include an alkylene group that may have an ether bond and/or an ester bond, such as —$CH_2$—, —$CH_2$—$CH_2$—, —$CH_2$—$CH_2$—O—, —$CH_2$—$CH_2$—$CH_2$—O— and —$CH_2$—$CH_2$—COO—$CH_2$—.

For the EPS, a modified polysiloxane in which a Si—O bond bonds a substituent having an epoxy group and a polysiloxane can also be exemplified as a preferred embodiment, since the modified polysiloxane has excellent heat resistance. A linear or cyclic modified polysiloxane represented by the formula (5) or (6) and a branched modified polysiloxane represented by the formula (7) are further preferred.

$R^6$ is preferably a hydrocarbon group having 1 to 25 carbon atoms or an alkoxyl group having 1 to 25 carbon atoms, more preferably an aliphatic or alicyclic hydrocarbon group having 1 to 20 carbon atoms or an aliphatic or alicyclic alkoxyl group having 1 to 20 carbon atoms, further preferably a methyl group or a methoxy group. An organic group for $R^6$ may be one kind or a plurality of kinds thereof may be mixed.

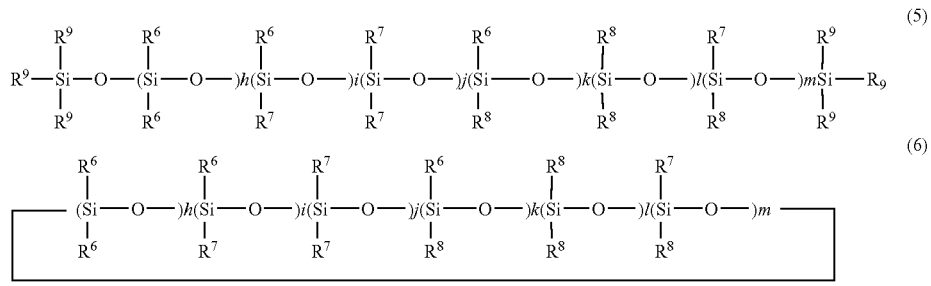

where $R^6$ is hydrogen, a hydroxyl group or an organic group having 1 to 25 carbon atoms and 0 to 5 oxygen atoms, $R^7$ is a substituent represented by the formula (8) or (9), $R^8$ is an alkoxy group having an alicyclic hydrocarbon group having 5 to 25 carbon atoms, $R^9$ is any group of $R^6$ to $R^8$, h, i, j, k, l and m are each an integer of $0 \leq h \leq 50$, $0 \leq i \leq 50$, $0 \leq j \leq 50$, $0 \leq k \leq 50$, $0 \leq l \leq 50$ and $0 \leq m \leq 50$, and i, j, k, l and m satisfy the condition that the number of $R^7$ is not less than 2 and the number of $R^8$ is not less than 1.

(7)

R¹⁰—Si(R¹⁰)(R¹⁰)—O—(Si(R¹⁰)(X)—O—)s(Si(X)(R¹⁰)—O—)t(Si(R¹⁰)(R¹⁰)—O—)u—Si(R¹⁰)(R¹⁰)—R¹⁰ where X is any group of $XXR^{10}SiO—$, $XR^{10}R^{10}SiO—$ and $R^{10}R^{10}R^{10}SiO—$, $R^{10}$ is any group of $R^6$ to $R^8$, $R^6$ is hydrogen, a hydroxyl group or an organic group having 1 to 25 carbon atoms and 0 to 5 oxygen atoms, $R^7$ is a substituent represented by the formula (8) or (9), $R^8$ is an alkoxy group having an alicyclic hydrocarbon group having 5 to 25 carbon atoms, s, t and u are each an integer which satisfy $1 \leq s+t \leq 50$ and $0 \leq u \leq 50$ and satisfy the condition that the total number of Si atoms in one molecule is not less than 4 to not more than 100 on average, and that the number of $R^7$ is not less than 2 and the number of $R^8$ is not less than 1.

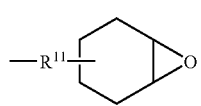
(8)

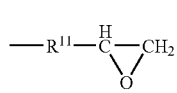
(9)

where $R^{11}$ is bonded to Si by an oxygen atom and is an organic group having 1 to 10 carbon atoms and 0 to 5 oxygen atoms, or oxygen.

$R^7$ is a substituent having an epoxy group and particularly preferred is a structure indicated in the formula (8) or the formula (9), and $R^7$ preferably has not less than two epoxy groups in a molecule. When not less than two epoxy groups are present in a molecule, a cured article is obtained having sufficient cross-linking density, high light resistance and high heat resistance.

Specific examples of the formula (8) include an oxymethylene cyclohexene oxide group and an oxycyclohexene oxide group. Specific examples of the formula (9) include an oxyglycidyl group, an oxyethylene glycidyl ether group and an oxypropylene glycidyl ether group. The substituents represented by the formula (8) are particularly preferred and an oxymethylene cyclohexene oxide group is further preferred because a high heat resistance can be obtained. The substituent may be one kind or a plurality of kinds thereof may be mixed.

$R^8$ is preferably an alkoxy group having an alicyclic hydrocarbon group having 6 to 20 carbon atoms and specific examples thereof include an oxycyclohexyl group and an oxynorbornyl group.

Specific examples of $R^{11}$ include an oxyalkylene group that may have an ether bond and/or an ester bond, such as —O—CH₂—, —O—CH₂—CH₂—, —O—CH₂—CH₂—O—, —O—CH₂—CH₂—CH₂—O—, —O—CH₂—CH₂—COO—CH₂— and —O—CH₂—CH₂—CH₂—CH₂—COO—CH₂—.

The EPS can be synthesized by the methods described below. Specifically, the methods include a method of introducing a substituent into an organopolysiloxane containing a Si—H group by a hydrosilylation reaction, a method of introducing a substituent into an organopolysiloxane containing a condensing group, such as an organohalosilane or organoalkoxysilane by a condensation reaction and a method of re-equilibration polymerization and a method of ring-opening polymerization of a cyclic organosiloxane.

Of these, the method of introducing a substituent into an organopolysiloxane containing a Si—H group by a hydrosilylation reaction is preferred for preparing a modified polysiloxane in which a substituent having an epoxy group and a polysiloxane are bonded by a Si—C bond, while the method of introducing a substituent into an organopolysiloxane containing a condensable group by a condensation reaction is preferred for preparing a modified polysiloxane in which a substituent having an epoxy group and a polysiloxane are bonded by a Si—O bond.

The hydrosilylation reaction is a method in which an organopolysiloxane containing a Si—H group is allowed to react with a vinyl group containing compound gradually or at once in the presence of a catalyst as the need arises.

Examples of the organopolysiloxane containing a Si—H group are not particularly limited and include non-aromatic linear organopolysiloxanes containing a Si—H group such as hydrogen-terminated polydimethylsiloxane, a methylhydrogensiloxane-dimethylsiloxane copolymer, polymethylhydrogensiloxane, polyethylhydrogensiloxane and a methylhydrogensiloxane-octylmethylsiloxane copolymer; aromatic linear organopolysiloxanes containing a Si—H group such as polyphenylhydrogensiloxane, polyphenyl(dimethylhydrogensiloxy)siloxane and a methylhydrogensiloxane-phenylmethylsiloxane copolymer; and cyclic organopolysiloxanes containing a Si—H group such as polymethylhydrogencyclosiloxane.

A polysiloxane containing a Si—H group can be obtained by hydrolyzing chlorosilane or an alkoxysilane containing a Si—H group to produce silanol and subjecting this to a condensation reaction. Alternatively, a polysiloxane containing a Si—H group is commercially available and examples thereof include HMS-031, 071, 151 and 301 which are methylhydrogensiloxane-dimethylsiloxane copolymers (available from Chisso Corporation) and HMS-991 and 992 which are polymethylhydrogensiloxane (available from Chisso Corporation).

Examples of the vinyl group containing compound include vinyl compounds containing an epoxy group and other vinyl compounds.

Examples of the vinyl compound containing an epoxy group include vinyl glycidyl ether, allyl glycidyl ether, glycidyl methacrylate, glycidyl acrylate and vinylcyclohexene oxide, and preferred are vinyl glycidyl ether and vinylcyclohexene oxide. Of these, at least one kind of vinyl compound containing an epoxy group is used.

Other vinyl compounds can be used without any particular limitation as long as an alicyclic hydrocarbon group is produced by the reaction. Examples thereof include a vinyl group containing hydrocarbons such as norbornene, cyclohexene, norbornadiene, dicyclopentadiene, vinylcyclohexane, vinylcyclohexene, vinyldecahydronaphthalene and 1,2,4-trivinylcyclohexane and triallyl isocyanurate, and preferred are norbornene, cyclohexene, and vinylcyclohexane. Of these, one kind or several kinds in combination may be used.

Examples of the catalyst for the hydrosilylation reaction include the metal elements in the 8th group of the periodic table, such metal being supported on a carrier such as alumina, silica or carbon black, a salt and a complex of the metal. As the metal in the 8th group of the periodic table, platinum, rhodium and ruthenium are preferred, and platinum is particularly preferred. Examples of the catalyst for the hydrosilylation reaction using platinum include chloroplatinic acid, a complex of chloroplatinic acid and an alcohol, an aldehyde or a ketone, a platinum-vinylsiloxane complex, a platinum-phosphine complex, a platinum-phosphite complex, dicarbonyldichloroplatinum and dicyclopentadienyl dichloroplatinum.

The amount of the catalyst varies greatly depending on the reactivities of the organosiloxane containing Si—H, the vinyl compound containing an epoxy group and the vinyl compound to be used, and therefore may not be easily determined. In general, however, the molar amount thereof is about 10 ppm to 10% relative to the number of moles of the Si—H or the vinyl group.

However, a more important thing in the present invention is the amount of the metal component remaining in the EPS.

The EPS may contain Fe or other metals eluted from the reactor in addition to the above-described catalysts. For example, when SUS316 alloy is used, Ni, Cr and Mo may be eluted in addition to Fe. Upon investigation of the present inventors, it has been found that these metals, especially transition metal components, are one of the causes of decreased light resistance.

From the viewpoint of industrial production, it is important to specify the total content of the transition metal components. For such reason, the total content of the transition metal components is specified, but in some cases, residual catalysts may consist mostly of the metal components. In addition, in the case of a laboratory synthesis where glass reactors are mainly used, attention should obviously be paid to the residual catalyst.

The residual amount of the metal components is preferably not more than 20 ppm, more preferably not more than 10 ppm, and most preferably not more than 5 ppm in terms of the element, based on the thermosetting composition for sealing light emitting devices of the present invention. When the total of the metal components is more than 20 ppm, the light resistance is undesirably decreased.

As a method for reducing the residual amount of metal components, a common method is to remove the metal components by adsorption by passing the reaction mixture after the reaction through an adsorbent such as activated carbon, silica gel, alumina powder or an ion exchange resin, which is also preferred in the present invention. A simple method also includes reducing the amount of the catalyst added when charging components for the synthesis reaction, and this method is an exampled as a method that accomplishes the object of the present invention. The reaction temperature is not particularly limited, but from the viewpoint of the reaction rate and the yield, the temperature is preferably 10 to 200° C., more preferably 30 to 150° C., are particularly preferably 50 to 120° C. The reaction can proceed even under a neat condition, but a solvent may be used. Examples of the solvent include ether solvents such as dioxane, tetrahydrofuran and propylene glycol monomethyl ether acetate, ketone solvents such as methyl ethyl ketone and methyl isobutyl ketone, hydrocarbon solvents such as toluene, xylene and cyclohexane, ester solvents such as ethyl acetate and butyl acetate, and alcohol solvents such as butyl cellosolve and butyl carbitol. Of these, ether solvents, ester solvents, ketone solvents and hydrocarbon solvents are preferred and dioxane, methyl isobutyl ketone, toluene, xylene, cyclohexane and butyl acetate are particularly preferred from the viewpoint of the solubility of the raw materials and the recovery of the solvent.

When a solvent is used for the synthesis reaction, the solvent is usually removed by distillation to obtain a final product. In that case, an unreacted vinyl compound containing an epoxy group and an unreacted vinyl compound can be removed simultaneously, and this method can be exemplified as a preferred method.

When the polarity of the unreacted substance differs greatly from that of polysiloxane, the unreacted substance can be removed by extraction by combining solvents that have different polarities to cause phase separation, and an example thereof includes an acetonitrile-hexane solvent as described in the Examples.

In this way, in order to remove unreacted raw materials and catalysts, it is desirable to conduct purification procedures.

Purification can prevent coloring and advantageously achieve improved storage stability such as anti-gelatinization.

As a condensation reaction for obtaining the EPS, a method in which an organopolysiloxane containing a condensable group is allowed to react with a hydroxy compound gradually or at once in the presence of a catalyst where necessary can be exemplified.

The organopolysiloxane containing a condensable group is not particularly limited, but examples thereof include non-aromatic organopolysiloxanes containing a condensable group such as polymethylsiloxane containing a condensable group, polyethylsiloxane containing a condensable group, polyethylmethylsiloxane containing a condensable group and polyoctylmethylsiloxane containing a condensable group, and aromatic organopolysiloxanes containing a condensable group such as polyphenylsiloxane containing a condensable group and polyphenylmethylsiloxane containing a condensable group. The non-aromatic organopolysiloxanes containing a condensable group are preferred because they have excellent light resistance. The organopolysiloxane containing a condensable group may have any of a linear, cyclic, branched or ladder structure. The organopolysiloxanes containing a condensable group may be used alone or in a combination.

Examples of the condensable group of the polysiloxane containing a condensable group include halogen, a hydroxyl group and an organic condensable group having 1 to 25 carbon atoms. Examples of the organic condensable group include alkoxy groups such as a methoxy group and an ethoxy group, acyloxy groups such as an acetoxy group, amino groups such as a dimethyl amino group and oxime groups such as a methyl ethyl ketoxime group. Preferred condensable groups are hydroxyl group, alkoxyl groups and acyloxy groups. The condensable groups may be used alone or in combination.

Examples of the hydroxy compound include a hydroxy compound containing an epoxy group and other hydroxy compounds.

Examples of the hydroxy compound containing an epoxy group include glycidol, hydroxyethyl glycidyl ether, hydroxymethyl cyclohexeneoxide, hydroxycyclohexeneoxide, and a caprolactone modified product of a hydroxy compound containing an epoxy group of these at least one kind of the hydroxy compound containing an epoxy group is used.

As the other hydroxy compounds, a hydroxy compound in which an alicyclic hydrocarbon group is produced by the reaction may be used, and cyclopentanol, cyclohexanol, cycloheptanol, cyclooctanol, norborneol and methyl derivatives thereof can be exemplified. Of these, cyclohexanol is preferred in view of its high availability.

Examples of the catalyst for the condensation reaction include titanate compounds such as tetraisopropyl titanate, aluminum compounds such as tris(acetylacetone)aluminum, zirconium compounds, tin compounds such as dibutyltin dilaurate, zinc compounds such as zinc octylate and lead compounds.

The reaction temperature is not particularly limited, but from the viewpoint of the reaction rate and the yield, the temperature is preferably 10 to 200° C., more preferably 40 to 160° C., and particularly preferably 60 to 130° C. The reaction can proceed even under a neat condition, but a solvent may be used. Examples of the solvent include dioxane, methyl isobutyl ketone, toluene, xylene and butyl acetate.

The EPS is obtained by removing unreacted raw materials or solvent as the need arises. An important thing is that the EPS has an APHA color number of not more than 50, preferably not more than 40, and further preferably not more than 30.

According to the investigation of the present inventors, a decrease in chromaticity caused by a decomposition reaction of a functional group in the side chain is remarkable in an EPS with an APHA color number exceeding 50, and the EPS is difficult to use for the sealing of light emitting devices because the change in color tone and the decrease in brightness during use are remarkable.

The APHA color number can be measured in accordance with the test method described in ASTM D1209 using the platinum-cobalt color standards of normal concentration.

In the present invention, the proportion of the epoxy groups to the alicyclic hydrocarbon groups is in the range of 1:100 to 100:1 based on the molar ratio of the two, and a proportion within this range is desirable because both excellent light resistance and excellent adhesiveness can be achieved.

In the present invention, the molar ratio of the Si—O units to the total moles of the epoxy group and the alicyclic hydrocarbon group is 1:1000, and a molar ratio within this range is desirable because a cured article having sufficient strength can be obtained.

In the present invention, by further using an epoxy resin, the adhesion properties between the sealing agent and the light emitting device can be increased.

Examples of the epoxy resin used in the present invention include aromatic glycidyl ether, glycidyl ether obtained by hydrogenating the aromatic ring of aromatic glycidyl ether, alicyclic epoxy resin and other epoxy resins.

Examples of the aromatic glycidyl ether include bisphenol epoxy resins in which a bisphenol such as bisphenol A, bisphenol F, bisphenol AD, bisphenol S, tetramethyl bisphenol A, tetramethyl bisphenol F, tetramethyl bisphenol AD, tetramethyl bisphenol S, tetrabromo bisphenol A, tetrachloro bisphenol A or tetrafluoro bisphenol A has been glycidylated, epoxy resins in which an other divalent phenol such as biphenol, dihydroxy naphthalene or 9,9-bis(4-hydroxyphenyl) fluorene has been glycidylated, epoxy resins in which a trisphenol such as 1,1,1-tris(4-hydroxyphenyl)methane or 4,4-(1-(4-(1-(4-hydroxyphenyl)-1-methylethyl)phenyl)ethylidene)bisphenol has been glycidylated, epoxy resins in which a tetrakisphenol such as 1,1,2,2-tetrakis(4-hydroxyphenyl)ethane has been glycidylated and novolac epoxy resins in which a novolac such as phenol novolac, cresol novolac, bisphenol A novolac, brominated phenol novolac or brominated bisphenol A novolac has been glycidylated.

The glycidyl ether obtained by hydrogenating the aromatic ring of aromatic glycidyl ether can be obtained by hydrogenating the aromatic ring of the aromatic glycidyl ether exemplified above in the presence of a catalyst such as a ruthenium catalyst or a rhodium catalyst.

Examples of the alicyclic epoxy resin include 3,4-epoxycyclohexylmethyl-3',4'-epoxycyclohexane carboxylate, 1,2-epoxy-4-(2-oxiranyl)cyclohexane adduct of 2,2-bis(hydroxymethyl)-1-butanol and bis(3,4-epoxycyclohexylmethyl)adipate.

Examples of other epoxy resins include glycidyl esters such as dimer acid glycidyl ester and hexahydrophthalic acid glycidyl ester, glycidyl amines such as triglycidyl isocyanurate, and linear aliphatic epoxides such as epoxidized soy bean oil and epoxidized polybutadiene.

The epoxy resin may be used alone or in combination. The amount to be used of the epoxy resin is 0.1 to 100 parts by mass based on 100 parts by mass of the EPS. The amount is more preferably 1 to 100 parts by mass, and further preferably 1 to 80 parts by mass. A sealing agent superior in adhesive properties when used with light emitting devices can be obtained by using an epoxy resin.

Examples of the curing agent for the epoxy resin used in the present invention include aliphatic amines such as ethylene diamine, triethylene pentamine, hexamethylene diamine, dimer acid modified ethylene diamine, N-ethyl aminopiperazine and isophorone diamine, aromatic amines such as metaphenylene diamine, paraphenylene diamine, 3,3'-diaminodiphenylsulfone, 4,4'-diaminodiphenylsulfone, 4,4'-diaminodiphenylmethane, 4,4'-diaminodiphenyl ether, mercaptans such as mercaptopropionic acid esters and a mercapto-terminated compound of epoxy resin, phenol resins such as bisphenol A, bisphenol F, bisphenol AD, bisphenol S, tetramethyl bisphenol A, tetramethyl bisphenol F, tetramethyl bisphenol AD, tetramethyl bisphenol S, tetrabromo bisphenol A, tetrachloro bisphenol A, tetrafluoro bisphenol A, biphenol, dihydroxy naphthalene, 1,1,1-tris(4-hydroxyphenyl)methane or 4,4-(1-(4-(1-(4-hydroxyphenyl)-1-methylethyl)phenyl)ethylidene)bisphenol, phenol novolac, cresol novolac, bisphenol A novolac, brominated phenol novolac and brominated bisphenol A novolac, polyols obtained by hydrogenating the aromatic ring of the phenols, alicyclic acid anhydrides such as poly(azelaic anhydride), methyltetrahydrophthalic anhydride, tetrahydrophthalic anhydride, methylhexahydrophthalic anhydride, hexahydrophthalic anhydride, 5-norbornene-2,3-dicarboxylic anhydride, norbornane-2,3-dicarboxylic anhydride, methyl-5-norbornene-2,3-dicarboxylic anhydride and methyl-norbornane-2,3-dicarboxylic anhydride, aromatic acid anhydrides such as phthalic anhydride, trimellitic anhydride and pyromellitic anhydride, imidazoles such as 2-methylimidazole, 2-ethyl-4-methylimidazole and 2-phenylimidazole and salts thereof, amine adducts obtained by reaction of the above-described aliphatic amines, aromatic amines and/or imidazoles with an epoxy resin, hydrazines such as adipic acid hydrazide, tertiary amines such as dimethylbenzylamine and 1,8-diazabicyclo[5.4.0]undecene-7, organic phosphines such as triphenylphosphine and dicyandiamide. Of these, preferred are alicyclic acid anhydrides and aromatic acid anhydrides, more preferred are alicyclic acid anhydrides, and particularly preferred are methylhexahydrophthalic anhydride, hexahydrophthalic anhydride, norbornane-2,3-dicarboxylic anhydride and methyl-norbornane-2,3-dicarboxylic anhydride.

The curing agent may be used alone or in a combination of two or more kinds.

The amount to be used of the curing agent for the epoxy resin is 1 to 200 parts by mass, and preferably 2 to 100 parts by mass relative to 100 parts by mass of the EPS.

When the amount is within the range of 1 to 200 parts by mass, a crosslinking reaction proceeds sufficiently and a sealing agent having excellent light resistance and heat resistance and low moisture permeability can be obtained.

In addition to the above-described components, conventionally known additives such as a curing accelerator, an antifoaming agent, a colorant, fluorescent materials, a denaturant, an anti-discoloring agent, inorganic fillers, a silane coupling agent, a light diffusing agent and a thermally conductive filler may be incorporated into the curable composition of the present invention if need be.

Examples of the curing accelerator include imidazoles such as 2-methylimidazole and 2-ethyl-4-methylimidazole, tertiary amines such as 1,8-diazabicyclo[5.4.0]undecene-7 and salts thereof, phosphines such as triphenylphosphine, phosphonium salts such as triphenylphosphonium bromide, aminotriazoles, metal catalysts such as acetylacetonate of tin compounds such as tin octylate and dibutyl tin dilaurate, zinc compounds such as zinc octylate, aluminum, chromium, cobalt and zirconium. The curing accelerators may be used alone or in a combination.

The curing method to be used in the present invention may be a known method.

Curing by heating is a method usually used for curing an epoxy resin, which is preferred in the present invention as well. The heating temperature may not be easily determined because it depends on the kind of the epoxy resin and the curing agent, but the temperature is mostly selected within a range of 80 to 200° C.

A method of curing by irradiation of ultraviolet (UV) ray is also preferred in the present invention.

In the present invention, a method of curing under a reduced pressure or a method of curing under an atmosphere of inert gas such as nitrogen, carbon dioxide, argon or helium may be used.

A light emitting diode is produced by sealing a light emitting device using the curable composition of the present invention.

The light emitting device to be used includes devices of various wavelengths including infrared, red, green, blue, purple and ultraviolet. An example is a light emitting device produced by laminating semiconductor materials on a substrate. In such case, examples of the semiconductor material include GaAs, GaP, GaAlAs, GaAsP, AlGaInP, GaN, InN, AlN, InGaAlN and SiC. Examples of the substrate include a single crystal of sapphire, spinel, SiC, Si, ZnO or GaN. In addition, a buffer layer may be formed between the substrate and the semiconductor material as needed. Examples of the buffer layer include GaN and AlN. The method of laminating a semiconductor material to a substrate is not particularly limited and for example, a MOCVD method, a HDVPE method or a liquid phase growth method may be used. As a structure for the light emitting devices, homojunction, heterojunction and double heterojunction structures having MIS junction, PN junction and/or PIN junction can be exemplified. In addition, a single or multiple quantum well structure can also be employed.

The wavelength of light from the light emitting device used in the present invention ranges widely from infrared, through red, green, blue and purple to ultraviolet, and practical use is possible even for light having a wavelength of 250 nm to 550 nm where conventional sealing agents deteriorate due to insufficient light resistance. The luminous wavelength refers to a peak wavelength of main light emission. By using the sealing agent of the present invention for a light emitting device, a white light emitting diode having a long lifespan, a high energy efficiency and a high color reproductivity can be obtained.

The light emitting diode of the present invention can be produced by sealing a light emitting device with the curable composition of the present invention. The light emitting device may be sealed only by the curable composition of the present invention, but an other sealing agent may also be used together with it for sealing. When using other sealing agent together with it, the device may be first sealed with the curable composition of the present invention and then the periphery sealed with the other sealing agent, or the device may be first sealed with the other sealing agent and then the periphery sealed with the curable composition of the present invention. Examples of the other sealing agent include an epoxy resin, a silicone resin, an acrylic resin, a urea resin, an imide resin and glass.

As a method for sealing a light emitting device with the curable composition of the present invention, a method comprising injecting a curable composition into a mold in advance and curing after immersing therein a lead frame in which a light emitting device is fixed, and a method of curing after injecting a curable composition into a mold in which a light emitting device is placed can be exemplified. As a method of injecting a curable composition, injection by a dispenser, transfer molding and injection molding can be exemplified. In addition, other sealing methods include dropping a curable composition on a light emitting device, stencil printing, screen printing, a method of curing by applying a composition through a mask, and a method of curing after injecting, by a dispenser, a curable composition into a cup in which a light emitting device is put on the lower part. In addition, the curable composition of the present invention can be used as a die bonding material for fixing a light emitting device to a lead terminal or package, a passivation film on a light emitting device and a package substrate.

The shape of the sealed part may be, for example, a bullet lens shape, plate or thin film.

Performance of the light emitting diode of the present invention can be improved by conventionally known methods which include: a method of forming a reflecting layer or a focusing layer on the back of the light emitting device; a method of forming a complementary color part at the bottom; a method of forming on a light emitting device a layer which absorbs light having a wavelength shorter than the peak wavelength of main light emission; a method comprising sealing the light emitting device and further molding the device with a hard material; a method in which a light emitting diode is inserted into a through hole and fixed; and a method in which a light emitting device is connected to a material of lead line by flip chip bonding and light is retrieved from the substrate side.

The light emitting diode of the present invention is useful as, for example, backlights of liquid crystal displays, lighting, light sources for various sensors, printers and copying machines, light sources for automobile display, a signal light, an indication light, display apparatuses, light sources for a sheet illuminant, displays, decorations and other lights.

The present invention is explained in more detail below. "Part(s)" in the Examples is based on mass unless otherwise specified.

The methods of evaluation are as follows.

(1) Epoxy Equivalent

The epoxy equivalent refers to the mass (g) of the epoxy resin that contains 1 equivalent of an epoxy group, as calculated in accordance with JIS K-7236.

(2) Color Number

The color number was determined by visual comparison with APHA standard liquid in accordance with ASTM D1209.

(3) Content of Element

Metal contents were measured by using a quadrupole ICP mass spectrometer (made by Thermo Elemental, X7-ICP-MS).

(4) Initial Light Transmittance

JASCO V-550 made by JASCO CORPORATION measured light transmittance at 350 nm, 400 nm and 450 nm using a 2 mm thick cured article. A light transmission of more than 80% was rated as "⊚", 70 to 80% as "○", and less than 50% as "X".

(5) Light Resistance

Settings are arranged so that a 2 mm thick cured article placed in a constant temperature dryer is irradiated with an ultraviolet ray from a UV irradiation apparatus (made by Ushio Inc., SP-7) through optical fiber. Light of 330 to 410 nm is applied using a 365 nm band-pass filter to achieve 2 W/cm$^2$.

A cured article which was not colored even after 80 hours from the start of the irradiation was rated as "⊚", an article colored in 40 to 80 hours as "○" and an article colored within 40 hours as "X".

SYNTHESIS EXAMPLE 1

A 1 L reactor equipped with a reflux condenser, a thermometer and a stirrer was charged with 100 g of a methylhydrogensiloxane-dimethylsiloxane copolymer (molecular weight 2780, Si—H, 20.7 bonds/molecule) and 200 g of dioxane, and the mixture was heated to 80° C. with stirring under a nitrogen atmosphere. After adding 0.6 g of a solution of platinum divinyltetramethyldisiloxane complex (0.22% by mass) in dioxane to the mixture, 92 g of a solution of norbornene (available from Wako Pure Chemicals Industries, Ltd., guaranteed reagent) (20% by mass) in dioxane was added thereto dropwise over 40 minutes and stirring was continued for 1 hour at 80° C. After adding 0.4 g of a solution of platinum divinyltetramethyldisiloxane complex (0.22% by mass) in dioxane thereto, 347 g of a solution of vinylcyclohexene oxide (available from DAICEL CHEMICAL INDUSTRIES, LTD., CELLOXIDE 2000) (20% by mass) in dioxane was added thereto dropwise over 120 minutes and stirring was continued for 1 hour at 80° C.

The reaction mixture was put in a round bottomed flask in which 100 g of activated carbon (available from Wako Pure Chemicals Industries, Ltd., guaranteed granule) was charged, and after shaking for 24 hours, the mixture was filtrated. The liquid obtained was heated under reduced pressure to remove the solvent, and the resultant was dissolved afresh in 150 g of hexane. By removing impurities with 300 g of acetonitrile, a modified polysiloxane in which a Si—C bond bonds a substituent having an epoxy group and polysiloxane was obtained. Sampling the reaction mixture in each step and confirming generation of hydrogen gas by decomposing the mixture with alkali confirmed quantitative progress of the reaction.

The EPS obtained had an epoxy equivalent of 342 and contained on average about 15 epoxy groups in a molecule. The Pt content was 3.4 ppm.

SYNTHESIS EXAMPLE 2

A 1 L reactor equipped with a reflux condenser, a thermometer and a stirrer was charged with 100 g of a methylhydrogensiloxane-dimethylsiloxane copolymer (molecular weight 3140, Si—H, 13.9 bonds/molecule) and 200 g of dioxane, and the mixture was heated to 80° C. with stirring under a nitrogen atmosphere. After adding 0.4 g of a solution of platinum divinyltetramethyldisiloxane complex (0.22% by mass) in dioxane to the mixture, 55 g of a solution of norbornene (available from Wako Pure Chemicals Industries, Ltd., guaranteed reagent) (20% by mass) in dioxane was added thereto dropwise over 20 minutes and stirring was continued for 30 minutes at 80° C. After adding 0.2 g of a solution of platinum divinyltetramethyldisiloxane complex (0.22% by mass) in dioxane thereto, 217 g of a solution of vinylcyclohexene oxide (available from DAICEL CHEMICAL INDUSTRIES, LTD., CELLOXIDE 2000) (20% by mass) in dioxane was added thereto dropwise over 80 minutes and stirring was continued for 1 hour at 80° C.

The reaction mixture was put in a round bottomed flask in which 100 g of activated carbon (available from Wako Pure Chemicals Industries, Ltd., guaranteed granule) was charged, and after shaking for 24 hours, the mixture was filtrated. The liquid obtained was heated under reduced pressure to remove the solvent, and the resultant was dissolved afresh in 150 g of hexane. By removing impurities with 300 g of acetonitrile, a modified polysiloxane in which a Si—C bond bonds a substituent having an epoxy group and polysiloxane was obtained. Sampling the reaction mixture in each step and confirming generation of hydrogen gas by decomposing the mixture with alkali confirmed quantitative progress of the reaction.

The EPS obtained had an epoxy equivalent of 463 and contained on average about 10 epoxy groups in a molecule. The Pt content was 2.8 ppm.

SYNTHESIS EXAMPLE 3

A 1 L reactor equipped with a reflux condenser, a thermometer and a stirrer was charged with 100 g of silanol-terminated polydimethylsiloxane (molecular weight 550, OH equivalent 345 g/eq) and 100 g of dioxane, and the mixture was heated to 80° C. with stirring under a nitrogen atmosphere. Thereto was added a mixture of 39.5 g of methyltrimethoxysilane and 0.08 g of tetraisopropyl titanate over 30 minutes, and stirring was continued for 1 hour. Thereto was added 8 g of cyclohexanol over 10 minutes and stirring was continued for 20 minutes. Subsequently, 62 g of 4-hydroxymethylene cyclohexene oxide was added thereto over 30 minutes and stirring was continued for 3 hours at 100° C.

The liquid obtained was heated under reduced pressure to remove raw materials such as solvent and methanol, and a modified polysiloxane in which a substituent having an epoxy group and polysiloxane are bonded by a Si—O bond was obtained. The progress of the reaction was confirmed by determining the quantity of generated methanol.

The EPS obtained had an epoxy equivalent of 386 and contained on average about 2.7 epoxy groups in a molecule. The color number (APHA) was 45.

EXAMPLE 1

To 100 parts of the EPS obtained in Synthesis Example 1 were added 44 parts of methylhexahydrophthalic anhydride and 1 part of diazabicycloundecene octylate. After stirring until homogeneous, defoaming was conducted to obtain a curable composition 1. The composition was poured into a 2 mm deep mold and a curing reaction was conducted at 120° C. for 2 hours and further at 150° C. for 2 hours, and a cured article was obtained. The properties of the obtained cured article are shown in Table 1.

EXAMPLE 2

To 90 parts of the EPS obtained in Synthesis Example 2 were added 10 parts of 3,4-epoxycyclohexylmethyl-3',4'-epoxycyclohexane carboxylate (epoxy equivalent 134), 41 parts of methylhexahydrophthalic anhydride and 1 part of diazabicycloundecene octylate. After stirring until homogeneous, defoaming was conducted to obtain a curable composition. The composition was poured into a 2 mm deep mold and a curing reaction was conducted at 120° C. for 2 hours and further at 150° C. for 2 hours, and a cured article was obtained. The properties of the obtained cured article are shown in Table 1.

EXAMPLE 3

To 100 parts of the EPS obtained in Synthesis Example 3 were added 39 parts of methylhexahydrophthalic anhydride and 1 part of diazabicycloundecene octylate. After stirring until homogeneous, defoaming was conducted to obtain a curable composition 3. The composition was poured into a 2 mm deep mold and a curing reaction was conducted at 120° C. for 2 hours and further at 150° C. for 2 hours, and a cured article was obtained. The properties of the obtained cured article are shown in Table 1.

COMPARATIVE EXAMPLE 1

50 parts of 3,4-epoxycyclohexylmethyl-3',4'-epoxycyclohexane carboxylate (epoxy equivalent 134), 50 parts of hydrogenated bisphenol A glycidyl ether (epoxy equivalent 273), 84 parts of methylhexahydrophthalic anhydride and 1 part of diazabicycloundecene octylate were mixed. After stirring until homogeneous, defoaming was conducted to obtain a curable composition. The composition was poured into a 2 mm deep mold and a curing reaction was conducted at 120° C. for 2 hours and further at 150° C. for 2 hours, and a cured article was obtained. The properties of the obtained cured article are shown in Table 1.

EXAMPLE 4

The curable composition 1 obtained in Example 1 was poured into a bullet-shaped mold of 4 mm in diameter, and a lead frame in which light emitting devices having a luminous wavelength of 400 nm were fixed was immersed therein. After defoaming in decreasing pressure, a curing reaction was conducted at 120° C. for 2 hours and further at 150° C. for 2 hours, and a light emitting diode was obtained. In this light emitting diode, peeling between the device and the sealed part or decrease in brightness was not found even after current was applied at 50 mA for 100 hours at room temperature.

COMPARATIVE EXAMPLE 2

The curable composition 4 obtained in Comparative Example 1 was poured into a bullet-shaped mold of 4 mm in diameter, and a lead frame in which light emitting devices having a luminous wavelength of 400 nm were fixed was immersed therein. After defoaming in decreasing pressure, a curing reaction was conducted at 120° C. for 2 hours and further at 150° C. for 2 hours, and a light emitting diode was obtained. In this light emitting diode, peeling between the device and the sealed part occurred and the brightness decreased, when current was applied at 50 mA for 100 hours at room temperature.

TABLE 1

| | | Example 1 | Example 2 | Example 3 | Comparative Example 1 |
|---|---|---|---|---|---|
| Initial light transmittance | 350 nm | ◯ | ◯ | ◯ | ◯ |
| | 400 nm | ◎ | ◎ | ◎ | ◎ |
| | 450 nm | ◎ | ◎ | ◎ | ◎ |
| Light resistance | | ◎ | ◯ | ◯ | X |

The invention claimed is:
1. A process for producing a light emitting device comprising the steps of:
   (i) sealing a light emitting device with a heat-curable composition comprising
      a modified polysiloxame containing, in a molecule, not less than one alicyclic hydrocarbon group and not less than two epoxy groups wherein the alicyclic hydrocarbon group is a nobornyl group and/or a cyclohexyl group that is not substituted by an epoxy group, the epoxy group is an ethynylcyclohexene oxide group, and the substituent having the epoxy group and the polysiloxane are bonded through a Si—C bond, and a curing agent for an epoxy resin, and (ii) heat-curing said heat-curable composition of the light emitting device, wherein the modified polysiloxane is represented by the formula (1) or the formula (2)

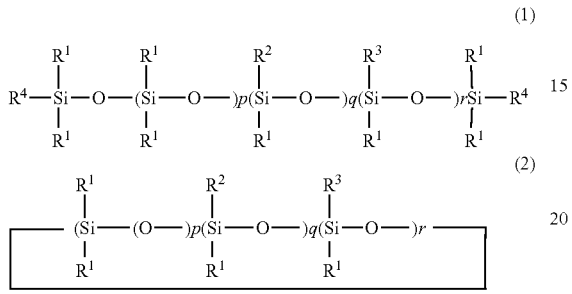

where $R^1$ is hydrogen, a hydroxyl group, an aliphatic hydrocarbon group having 1 to 6 carbon atoms or an alkoxy group having 1 to 6 carbon atoms, $R^2$ is an ethynylcyclohexane oxide group, $R^3$ is a norbornyl group and/or a cyclohexyl group that is not substituted by an epoxy group, $R^4$ is any group of $R^1$ to $R^3$, p and r are each an integer of $0 \leq p \leq 50$ and $1 \leq r \leq 50$, and q is an integer of $0 \leq q \leq 50$ when two $R^4$s are both $R^2$, $1 \leq q \leq 50$ when one of the $R^4$s is $R^2$, and $2 \leq q \leq 50$ when neither of the two $R^4$s is $R^2$ or no $R^4$ is present.

2. The process according to claim 1, wherein said heat-curable composition contains not more than 20 ppm of transition metal components in total in terms of an element.

3. The process according to claim 1, wherein the modified polysiloxane has an APHA color number of not more the 50.

4. The process according to any of claims 1, 2, or 3, wherein said heat-curable composition comprises 100 parts by mass of the modified polysiloxane 0.1 to 100 parts by mass of an epoxy resin and 1 to 200 parts by mass of the curing agent for the epoxy resin.

5. A light emitting device or a display device using said light emitting device, said light emitting device being produced by using the process according to any of claims 1, 2, or 3.

6. A light emitting component and a display device using the component, said component being produced by sealing a heat-curable composition comprising 100 parts by mass of a modified polysiloxane containing, in a molecule, not less than one alicyclic hydrocarbon group and not less than two epoxy groups wherein the alicyclic hydrocarbon group is a norbonyl group and/or a cyclohexyl group that is not substituted by an epoxy group, the epoxy group is an ethynylcyclohexene oxide group, and the substituent having the epoxy group and the polysiloxane are bonded through a Si—C bond, 0.1 to 100 parts by mass of an epoxy resin, and 1 to 200 parts by mass of curing agent for the epoxy resin wherein the modified polysiloxane is represented by the formula (1) or the formula (2)

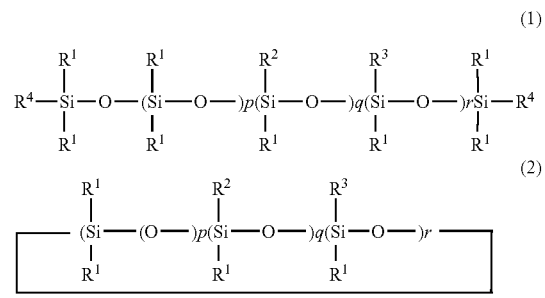

where $R^1$ is hydrogen, a hydroxyl group, an aliphatic hydrocarbon group having 1 to 6 carbon atoms or an alkoxy group having 1 to 6 carbon atoms, $R^2$ is an ethynylcyclohexene oxide group, $R^3$ is a norbornyl group and/or a cyclohexyl group that is not substituted by an epoxy group, $R^4$ is any group of $R^1$ to $R^3$, p and r are each an integer of $0 \leq p \leq 50$ and $1 \leq r \leq 50$, and q is an integer of $0 \leq q \leq 50$ when two $R^4$s are both $R^2$, $1 \leq q \leq 50$ when one of the two $R^4$s is $R^2$, and $2 \leq q \leq 50$ when neither of the two $R^4$s is $R^2$ or no $R^4$ is present.

* * * * *

UNITED STATES PATENT AND TRADEMARK OFFICE
CERTIFICATE OF CORRECTION

PATENT NO.       : 7,879,405 B2
APPLICATION NO.  : 11/140197
DATED            : February 1, 2011
INVENTOR(S)      : Satoru Kaji et al.

It is certified that error appears in the above-identified patent and that said Letters Patent is hereby corrected as shown below:

In claim 1, column 16, line 64, "polysiloxame" should read --polysiloxane--.

In claim 1, column 16, line 67, "nobornyl" should read --norbornyl--.

In claim 1, column 17, lines 18-23, in the structure for formula (2),

"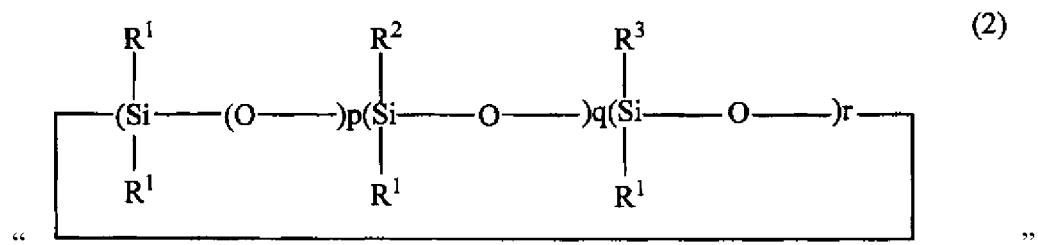"

should read

--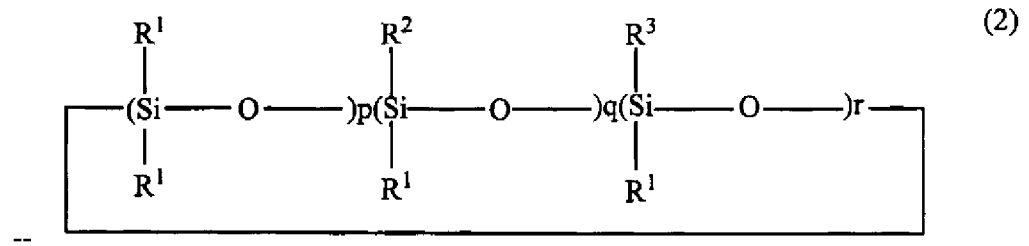--.

In claim 6, column 18, line 11, "norbonyl" should read --norbornyl--.

In claim 6, column 18, line 17, "mass of curing agent" should read --mass of a curing agent--.

Signed and Sealed this
Twenty-seventh Day of December, 2011

David J. Kappos
*Director of the United States Patent and Trademark Office*

In claim 6, column 18, lines 27-32, in the structure for formula (2),
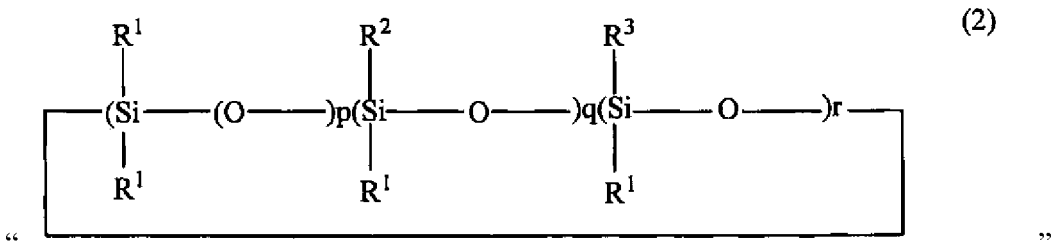
should read
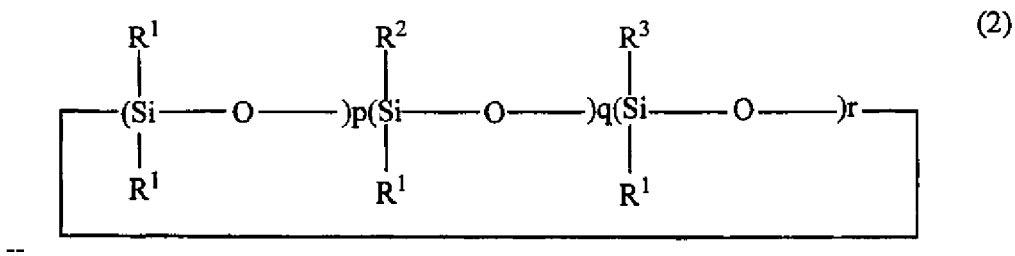
In claim 6, column 18, line 37, "norbonyl" should read --norbornyl--.